(12) United States Patent
Typrowicz

(10) Patent No.: US 12,047,061 B2
(45) Date of Patent: Jul. 23, 2024

(54) BIDIRECTIONAL COMMUNICATION CIRCUIT, SYSTEM AND METHOD FOR BIDIRECTIONAL COMMUNICATION

(71) Applicant: Aptiv Technologies AG, Schaffhausen (CH)

(72) Inventor: Wojciech Typrowicz, Dublin (IE)

(73) Assignee: Aptiv Technologies AG, Schaffhausen (CH)

( * ) Notice: Subject to any disclaimer, the term of this patent is extended or adjusted under 35 U.S.C. 154(b) by 483 days.

(21) Appl. No.: 17/507,121

(22) Filed: Oct. 21, 2021

(65) Prior Publication Data
US 2022/0149795 A1 May 12, 2022

(30) Foreign Application Priority Data

Nov. 11, 2020 (EP) .................................. 20206951

(51) Int. Cl.
*H03K 17/60* (2006.01)
*G06F 13/40* (2006.01)

(52) U.S. Cl.
CPC ....... *H03K 17/602* (2013.01); *G06F 13/4068* (2013.01)

(58) Field of Classification Search
CPC .................................................. H03K 17/602
USPC ....................................................... 327/482
See application file for complete search history.

(56) References Cited

U.S. PATENT DOCUMENTS

| 6,034,995 | A | 3/2000 | Eisele et al. |
| 2002/0150116 | A1* | 10/2002 | Huang ................ H04L 25/0282 375/259 |
| 2003/0094979 | A1 | 5/2003 | Taylor |
| 2014/0298930 | A1 | 10/2014 | Hoshika et al. |
| 2016/0065156 | A1 | 3/2016 | Candage |

FOREIGN PATENT DOCUMENTS

| EP | 0643515 | 6/2001 |
| EP | 3043472 | 2/2019 |
| WO | 2011025557 | 3/2011 |

OTHER PUBLICATIONS

"Extended European Search Report", EP Application No. 20206951.4, Apr. 19, 2021, 8 pages.

* cited by examiner

*Primary Examiner* — Tomi Skibinski
(74) *Attorney, Agent, or Firm* — Harness, Dickey & Pierce, P.L.C.

(57) ABSTRACT

Communication circuit for bidirectional communication. A switching part is provided including a first BJT having a first base, a first collector, and a first emitter connected to an IO line. The first BJT is activated in response to an input data signal. A transmitter part is provided including a second BJT having a second base connected to the first collector, and a second collector connected to an output. A receiver part is provided comprising a third BJT having a third base connected to an input, and a third collector connected to the first base and to the IO line. A diode is provided in the IO line for impeding current associated with an input data signal and conducting a current associated with an output data signal.

20 Claims, 1 Drawing Sheet

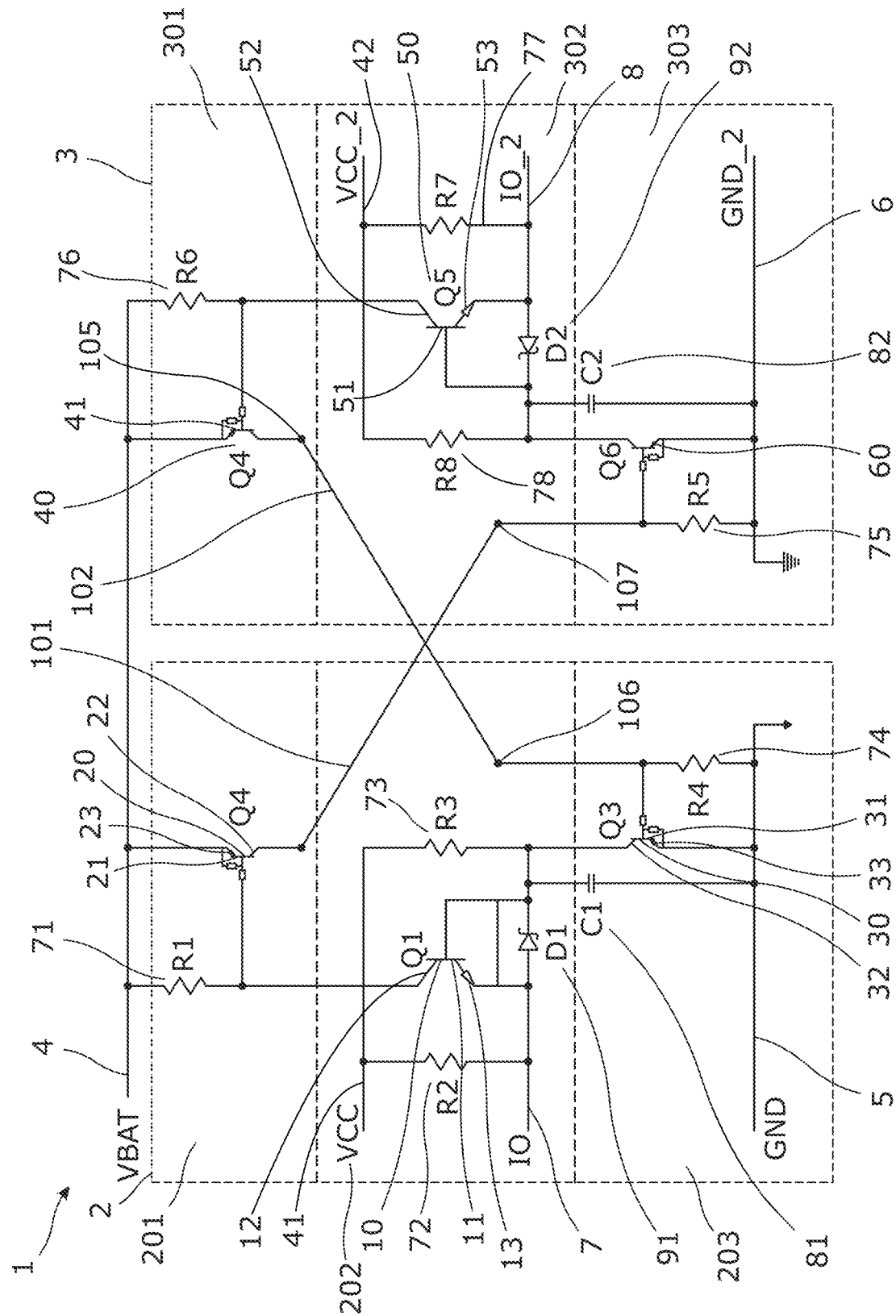

BIDIRECTIONAL COMMUNICATION CIRCUIT, SYSTEM AND METHOD FOR BIDIRECTIONAL COMMUNICATION

CROSS-REFERENCE TO RELATED APPLICATION

This application claims priority to European Patent Application Number 20206951.4, filed Nov. 11, 2020, the disclosure of which is hereby incorporated by reference in its entirety herein.

BACKGROUND

Communication data lines are used to transmit data and signals between different circuit modules within a system. In instances where circuit modules are separated by longer distances, the different circuit modules will often have separate ground connections. However, voltage shifts between the different grounds can lead to ground loops and signal distortion. For instance, in a vehicle E/E architecture, wiper blade breaking may be controlled using a H-Bridge controller having a field effect transistor (FET) switched by a control signal. If the ground current for the FET rises by around 2V, and the load is switched off, the energy from the ground wire may cause a negative voltage kickback of around −20V. In this scenario, the logic state of the H-Bridge controller cannot be recognised, risking failure to operate correctly and potentially even damage to the H-Bridge controller itself. As a consequence, it is normally necessary to provide galvanic isolators between communicating circuit modules.

Galvanic isolators act to provide signal isolation by preventing the direct flow of current between the two communicating modules using components such as optocouplers or iCouplers. However, these components are relatively expensive, especially when the cost is considered in the context that the isolation only becomes necessary if the ground shifts by more than a few volts. This is a particular issue in automotive applications where a large number of communicating modules are distributed around the vehicle. Such modules are often associated with vehicle sensor systems, meaning that they are particularly sensitive to signal disturbances. At the same time, the component costs for implementing the required isolation for each sensor is significant, and only continues to increase as vehicle E/E architectures become more complex.

A further issue with conventional galvanic isolators is that they are unidirectional. As such, they are not suitable for bidirectional communication lines, such as I2C buses. Consequently, new solutions are needed for situations where separated modules need to communicate back and forth with one another.

SUMMARY

The present disclosure relates generally to techniques, including apparatuses, circuits, systems, and methods, for enabling bidirectional communication, including transfer of a data signal, including for enabling bidirectional communication of serial data transmissions, which can address problems identified in the Background, as well as solving other issues that are apparent from reading this disclosure.

According to a first aspect there is provided a communication circuit for bidirectional communication with a corresponding second communication circuit, the communication circuit including: an IO line for connection to a communicating device; a switching part including a first bipolar junction transistor, BJT, having a first base, a first collector, and a first emitter connected to the IO line at a first position, wherein the switching part is configured to activate the first BJT in response to an input data signal on the IO line; a transmitter part including a second BJT having a second base connected to the first collector and a second collector connected to an output for outputting a data signal to the second communication circuit when the second BJT is activated by the first BJT; a receiver part including a third BJT having a third base connected to an input for receiving a data signal from the second communication circuit and a third collector connected to the first base and to the IO line at a second position for generating an output data signal in the IO line, and wherein the first and third BJTs are one of NPN BJTs and PNP BJTs, and the second BJT is the other of the NPN BJT and PNP BJT, and wherein the switching part further includes a diode in the IO line between the first and second positions for impeding current associated with an input data signal in the IO line and conducting a current associated with an output data signal in the IO line when the third BJT is activated.

In this way, data signals may be transmitted over the transmitter lines without disturbances which could otherwise arise from different communication circuits having separate ground connections. As such, both communication circuits are protected by the use of bipolar junction transistors (BJTs). As such, each communicating devices may transmit and receive data signals with the other through a single IO line. BJTs are also significantly less expensive than galvanic isolator components. Consequently, an inexpensive communication circuit may be provided which allows for bidirectional communications and is not sensitive to voltage differences between separate ground connections.

In embodiments, the first and third BJTs are NPN BJTs and the second BJT is a PNP BJT.

In embodiments, the communicating device is an open drain communicating device.

In embodiments, the communication circuit further includes a pull-up resistor connected to the IO line.

In embodiments, the current associated with an input data signal in the IO line flows to the communicating device and the current associated with an output data signal in the IO line flows to ground through the third BJT. In this way, an open drain communicating device may activate to sink current from the IO line for inputting a data signal to the communications circuit. Conversely, the third BJT may sink current from the IO line to ground for generating an output data signal to the open drain communicating device.

In embodiments, the communication circuit further includes a decoupling capacitor C1 between the IO line and ground. This may minimise noise on the signal output from the communications device.

In embodiments, the communication circuit further includes a collector resistor connected to the first collector of the first BJT. In this way, current through the first BJT is regulated, and hence the stability at the second base of the second BJT is improved.

In embodiments, the communication circuit further includes a collector resistor connected to the third collector of the third BJT. In this way, current through the third BJT is regulated.

In embodiments, the communication circuit further includes a resistor connected between the input and ground. In this way, the current associated with the data signal transmitted from a second communications circuit to the input terminal of the first communications circuit is regulated, and hence the stability at the third base of the third BJT is improved.

According to a second aspect there is provided a communication system for bidirectional communication including: a first communication circuit being a communication circuit according to the above; and a second communication circuit being a communication circuit according to the above and being for communication with the first communication circuit. In this way, a communicating system is provided for bidirectional communication between two separated circuits.

In embodiments, the communication system further includes: a first transmitter line connecting between the output of the first communication circuit and the input of the second communication circuit; and a second transmitter line connecting between the output of the first communication circuit and the input of the second communication circuit.

In embodiments, the first communication circuit and the second communication circuit have separate ground connections.

In embodiments, the first communication circuit and the second communication circuit have a common positive supply rail.

In embodiments, the third BJT of the first communication circuit and the third BJT of the second communication circuit have separate voltage common collector connections. In this way, the communications circuit may transfer data signals between different communicating devices operating at different VCC levels.

According to a third aspect there is provided a method for bidirectional communication between a communication circuit and a corresponding second communication circuit, the method including: receiving an input data signal on an IO line from a communicating device; providing a switching part including a first bipolar junction transistor, BJT, having a first base, a first collector, and a first emitter connected to the IO line at a first position; configuring the switching part to activate the first BJT in response to an input data signal on the IO line; connecting, in a transmitter part, a second base of a second BJT to the first collector for activating the second BJT when the first BJT is activated; connecting a second collector of the second BJT to an output for outputting a data signal to the second communication circuit when the second BJT is activated; providing a receiver part including a third BJT having a third base connected to an input and a third collector connected to the first base and to the IO line at a second position; and receiving a data signal from the second communication circuit at the input for activating the third BJT for generating an output data signal in the IO line, wherein the first and third BJTs are one of NPN BJTs and PNP BJTs, and the second BJT is the other of the NPN BJT and PNP BJT, and wherein the switching part further includes a diode in the IO line between the first and second positions for impeding current associated with an input data signal in the IO line and conducting a current associated with an output data signal in the IO line when the third BJT is activated.

BRIEF DESCRIPTION OF DRAWING

An illustrative embodiment will now be described with reference to the accompanying drawing in which FIG. 1 shows a schematic of a communication system.

DETAILED DESCRIPTION

FIG. 1 shows an illustrative embodiment of a communication system 1 having a first circuit 2 and second circuit 3 and used for transmitting open drain data signals, such as I2C bus signals, between Input/Output data line IO 7 in the first circuit and Input/Output data line IO_2 8 in the second circuit. As such, the first and second circuits represent separate modules within the system for transmitting data to one another.

The circuits are communicatively connected by a first transmitter line 101 and a second transmitter line 102. The first transmitter line 101 is connected between a first output terminal 104 in the first circuit 2 and a second input terminal 107 in the second circuit 3. Conversely, the second transmitter line 102 is connected between a second output terminal 105 in the second circuit 3 and a first input terminal 106 on the first circuit 2. The first and second circuits 2,3 share a common positive rail VBAT 4 from the battery, but have separate connections to ground, with the first circuit 2 being connected to a first ground line GND 5, and the second circuit 3 being connected to a second ground line GND_2 6.

The first and second circuits 2,3 comprise corresponding components, arranged in the same way, albeit that they are shown mirrored to one another in FIG. 1 for simplicity. Each circuit includes components forming a transmitter part 201, 301, a receiver part 203,303 and a switching part 202,302 which controls whether the transmitter part 201,301 or receiver part 203,303 is operably connected to the data lines IO 7 and IO_2 8. The transmitter parts 201,301 are localised around the PNP bipolar junction transistor (BJT) Q2 20 in the first circuit 2 and PNP BJT Q4 40 in the circuit 3. The receiver parts 203,303 are localised around the NPN BJT Q3 30 in the first circuit 2 and Q6 60 in the second circuit 3. The switching parts 202,302 is localised around NPN BJT transistor Q1 10 and diode D1 91 in the first circuit 2, and NPN BJT Q5 50 and diode D2 92 in the second circuit 3.

Turning to the switching part 202 of the first circuit 2, the NPN BJT Q1 10 is arranged in an open collector configuration with a first pull-up resistor 72 being provided for generating a high signal at the common collector voltage VCC 41 within IO 7. A diode D1 91 is provided along IO 7 between the pins for emitter 13 and base 11. At the same time, the base 11 is connected to VCC 41 through resistor R3 73. As such, when IO 7 is set high, Q1 is inactive because both the base 11 and the emitter 13 are connected to VCC 41. Conversely, when a signal is applied to IO 7 by a connected open drain communicating device, Q1 10 is activated as a result of the generated voltage between base 11 and the emitter 13. That is, diode D1 91 impedes current flow from VCC 41, thereby holding base 11 high, as the emitter 13 is sinked through the open drain connection. Accordingly, the switching part 202 is configured to activate BJT Q1 10 in response to an input data signal applied by a communicating device connected to IO 7.

The collector 12 of Q1 10 is connected to the base 21 of PNP BJT Q2 20 as an output and VBAT 4 through collector resistor (R1) 71. Collector resistor R1 71 functions to regulate the current through BJT Q1 10 which improves the stability of the operation of BJT Q2 20.

PNP BJT Q2 20 forms part of the transmitter part 201 and is provided in a common collector configuration, with its emitter 23 connected to VBAT 4, and its collector 22 providing the output through the first transmitter line 101. As a consequence of this arrangement, activation of Q1 10 causes a low signal to be applied to the base 21 of Q2, which thereby activates it to apply VBAT through the first transmitter line 101 as a data signal.

In the receiver part 203, the NPN BJT Q3 30 has a base 31 connected to the second transmitter line 102 for receiving a data signal from the second circuit 3. An input resistor R4

74 is provided for regulating in the input current in the second transmitter line 102. Q3 includes an emitter 33 provided in a common emitter configuration, with the emitter 33 connected to GND 5, and the collector 32 connected to IO 7 as an output and VCC 41 through resistor R3 73. When a high signal is transmitted through the second transmitter line 102, the emitter 33 and Q3 is activated, which draws current to GND 5, forcing IO 7 to a low state. A first decoupling capacitor C1 81 is provided between IO 7 and GND 5 for removing noise in the signal generated in IO 7.

As shown in FIG. 1, the second circuit 3 contains corresponding components to those of the first circuit 2 and therefore the description of these components has been omitted for conciseness.

In use, an open drain data signal is applied to one of the data lines IO 7 and IO_2 8 by a communicating device, for instance, an integrated circuit. The communicating device sinks current in its low voltage active state (logic 0). In the communicating device's non-active state (logic 1), the pull-up resistors R2 72 and R7 77 hold IO 7 and IO_2 8 in a high state. Communicating devices may therefore communicate data by transmitting a sequence of logic state 0 and 1 periods, with each period representing a bit of data.

When a logic 0 signal is transmitted from the first circuit 2 to the second circuit 3, current flows on the first data line IO 7 to force a low signal. This activates Q1 by forcing a high signal at its base 11, thereby switching the circuit to a transmitting mode. The activation of Q1 10 in turn generates a low signal at the base 21 of Q2 20, thereby activating Q2 to transmit a high signal over the first transmitter line 101.

In this scenario, the second circuit 3 is acting as a receiver. The high signal on the first transmitter line 101 activates NPN BJT Q6, thereby allowing current to be drawn through diode D2 92 to GND_2 6 and forcing IO_2 8 to a low state which corresponds to the low signal applied to IO 7. At the same time, Q5 50, Q4 40 and Q3 30 are not active, and hence there is no risk to latch the line.

In reverse, when a data signal is transmitted from the second circuit 3 to the first circuit 2, a low signal will be applied to the second data line IO_2 8. This activates Q5 by forcing a high signal at its base 51, thereby switching the circuit to a transmitting mode. The activation of Q5 50 in turn generates a low signal at the base 41 of Q4 40, thereby activating Q4 to transmit a high signal over the second transmitter line 102. At the first circuit 2, this high signal on the second transmitter line 102 activates NPN BJT Q3, thereby allowing current to be drawn through diode D1 91 to GND 5 and forcing IO 7 to a low state corresponding to the low signal applied to IO_2 8. At the same time, Q1 10, Q2 20 and Q6 60 are not active, and hence again there is no risk of the line being latched.

As such, with the above arrangement, the configuration of Q1 10 and diode D1 91 in the first circuit 1, and Q5 50 and diode D1 92 in the second circuit 2, dictates whether these circuits are operating in a receiving mode or a transmitting mode.

In this way, the communication circuit 1 may provide for the bidirectional transmission of digital signals between the first and second circuits 2,3, without disturbances that could arise from voltage shifts between GND 5 and GND_2 6. That is, the use of BJTs, which are current controlled devices, rather than voltage-controlled FETs, means that the circuit is not sensitive to voltage difference between GND 5 and GND_2 6. Indeed, differences almost as high as VBAT may be tolerated. As such, both circuits are protected. At the same time, the required data transfer rate of 100 kbps for I2C bus transmissions may be achieved.

Moreover, as the high voltage level is dictated by VCC 41 for the first circuit 2 and VCC_2 42 for the second circuit 3, the communication circuit 1 may provide a voltage level shift in the data signal between the IO 7 and IO 8. For example, a serial data signal with a high signal at 3.3V may be translated to a high signal at 5V.

It will be understood that the embodiment illustrated above show applications only for the purposes of illustration. In practice, embodiments may be applied to many different configurations, the detail of which being straightforward for those skilled in the art to implement.

What is claimed is:

1. A communication circuit for bidirectional communication with a corresponding second communication circuit, the communication circuit comprising:
    an IO line for connection to a communicating device;
    a switching part comprising a first bipolar junction transistor, BJT, having a first base, a first collector, and a first emitter connected to the IO line at a first position, wherein the switching part is configured to activate the first BJT in response to an input data signal on the IO line;
    a transmitter part comprising a second BJT having a second base connected to the first collector and a second collector connected to an output for outputting a data signal to the second communication circuit when the second BJT is activated by the first BJT;
    a receiver part comprising a third BJT having a third base connected to an input for receiving a data signal from the second communication circuit and a third collector connected to the first base and to the IO line at a second position for generating an output data signal in the IO line, and
    wherein the first and third BJTs are one of NPN BJTs and PNP BJTs, and the second BJT is the other of the NPN BJT and PNP BJT, and
    wherein the switching part further comprises a diode in the IO line between the first and second positions for impeding current associated with an input data signal in the IO line and conducting a current associated with an output data signal in the IO line when the third BJT is activated.

2. The communication circuit according to claim 1, wherein the first and third BJTs are NPN BJTs and the second BJT is a PNP BJT.

3. The communication circuit according to claim 2, wherein the communicating device is an open drain communicating device.

4. The communication circuit according to claim 1, further comprises a pull-up resistor connected to the IO line.

5. The communication circuit according to claim 1, wherein the current associated with an input data signal in the IO line flows to the communicating device and the current associated with an output data signal in the IO line flow to ground through the third BJT.

6. The communication circuit according to claim 1, further comprises a decoupling capacitor C1 between the IO line and ground.

7. The communication circuit according to claim 1, further comprising a collector resistor connected to the first collector of the first BJT.

8. The communication circuit according to claim 1, further comprising a collector resistor connected to the third collector of the third BJT.

9. The communication circuit according to claim 1, further comprising a resistor connected between the input and ground.

10. A communication system comprising:
a first communicator circuit configured for bidirectional communication with a second communicator circuit, the first communicator circuit and the second communicator circuit each comprising:
an IO line for receiving an input data signal from a communication device;
a switching part comprising a first bipolar junction transistor, BJT, having a first base, a first collector, and a first emitter connected to the IO line at a first position, wherein the switching part is configured to activate the first BJT in response to the input data signal on the IO line;
a transmitter part comprising a second BJT having a second base connected to the first collector and a second collector connected to an output for outputting a data signal to the second communication circuit when the second BJT is activated by the first BJT;
a receiver part comprising a third BJT having a third base connected to an input for receiving a data signal from the second communication circuit and a third collector connected to the first base and to the IO line at a second position for generating an output data signal in the IO line, and
wherein the first and third BJTs are one of NPN BJTs and PNP BJTs, and the second BJT is the other of the NPN BJT and PNP BJT, and
wherein the switching part further comprises a diode in the IO line between the first and second positions for impeding current associated with an input data signal in the IO line and conducting a current associated with an output data signal in the IO line when the third BJT is activated.

11. The communication system according to claim 10, further comprising:
a first transmitter line connecting between the output of the first communication circuit and the input of the second communication circuit; and
a second transmitter line connecting between the output of the first communication circuit and the input of the second communication circuit.

12. The communication system according to claim 10, wherein the first communication circuit and the second communication circuit have separate ground connections.

13. The communication system according to claim 10, wherein the first communication circuit and the second communication circuit have a common positive supply rail.

14. The communication system according to claim 10, wherein the third BJT of the first communication circuit and the third BJT of the second communication circuit have separate voltage common collector connections.

15. A method for bidirectional communication between a communication circuit and a corresponding second communication circuit, the method comprising:
receiving an input data signal on an IO line from a communicating device;
providing a switching part comprising a first bipolar junction transistor, BJT, having a first base, a first collector, and a first emitter connected to the IO line at a first position;
configuring the switching part to activate the first BJT in response to an input data signal on the IO line;
connecting, in a transmitter part, a second base of a second BJT to the first collector for activating the second BJT when the first BJT is activated;
connecting a second collector of the second BJT to an output for outputting a data signal to the second communication circuit when the second BJT is activated;
providing a receiver part comprising a third BJT having a third base connected to an input and a third collector connected to the first base and to the IO line at a second position; and
receiving a data signal from the second communication circuit at the input for activating the third BJT for generating an output data signal in the IO line,
wherein the first and third BJTs are one of NPN BJTs and PNP BJTs, and the second BJT is the other of the NPN BJT and PNP BJT, and
wherein the switching part further comprises a diode in the IO line between the first and second positions for impeding current associated with an input data signal in the IO line and conducting a current associated with an output data signal in the IO line when the third BJT is activated.

16. The method of claim 15, wherein the first and third BJTs are NPN BJTs and the second BJT is a PNP BJT.

17. The method of claim 16, wherein the communicating device is an open drain communicating device.

18. The method of claim 15, wherein the communication circuit further comprises a pull-up resistor connected to the IO line.

19. The method of claim 15, wherein the current associated with an input data signal in the IO line flows to the communicating device and the current associated with an output data signal in the IO line flow to ground through the third BJT.

20. The method of claim 15, wherein the communication circuit comprises a decoupling capacitor C1 between the IO line and ground.

* * * * *